(12) United States Patent
Kang

(10) Patent No.: US 12,200,977 B2
(45) Date of Patent: Jan. 14, 2025

(54) LARGE AREA ORGANIC LIGHT-EMITTING DIODE DISPLAY

(71) Applicant: LG Display Co., Ltd., Seoul (KR)

(72) Inventor: Imkuk Kang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 172 days.

(21) Appl. No.: 17/875,186

(22) Filed: Jul. 27, 2022

(65) Prior Publication Data

US 2022/0367583 A1 Nov. 17, 2022

Related U.S. Application Data

(63) Continuation of application No. 16/154,956, filed on Oct. 9, 2018, now Pat. No. 11,430,840.

(30) Foreign Application Priority Data

Oct. 16, 2017 (KR) .................. 10-2017-0134268

(51) Int. Cl.
*H10K 59/122* (2023.01)
*H01L 27/12* (2006.01)
(Continued)

(52) U.S. Cl.
CPC ....... *H10K 59/122* (2023.02); *H01L 27/1225* (2013.01); *H01L 27/124* (2013.01);
(Continued)

(58) Field of Classification Search
CPC ...... H10K 59/122; H10K 50/11; H10K 50/81; H10K 50/82; H10K 50/824; H10K 50/84;
(Continued)

(56) References Cited

U.S. PATENT DOCUMENTS 9,859,520 B2 1/2018 Kim
10,591,787 B2 3/2020 Shim
(Continued)

FOREIGN PATENT DOCUMENTS

CN 106206645 A 12/2016
CN 106935625 A 7/2017
(Continued)

OTHER PUBLICATIONS

Office Action dated Sep. 17, 2021, issued in corresponding Korean Patent Application No. 10-2017-0134268. Note: KR 10-2016-0127459 is already of record.
(Continued)

*Primary Examiner* — Khaja Ahmad
*Assistant Examiner* — Sun Mi Kim King
(74) *Attorney, Agent, or Firm* — Morgan, Lewis & Bockius LLP

(57) ABSTRACT

An organic light-emitting diode display includes an auxiliary connection line on a substrate; an auxiliary cathode on and connected to the auxiliary connection line; a passivation layer covering the auxiliary cathode; an overcoat layer on the passivation layer; a connection terminal connected to the auxiliary cathode on the overcoat layer; an undercut opening on the overcoat layer exposing a portion of the auxiliary cathode, an under area being in the undercut opening and under one side of the connection terminal; a bank having a size larger than the undercut opening and exposing the entire undercut opening; an organic emission layer on a region other than the under area in the undercut opening exposing the portion of the auxiliary cathode; and a cathode directly connected to the exposed portion of the auxiliary cathode on which the organic emission layer is not formed in the under area of the undercut opening.

14 Claims, 17 Drawing Sheets

(51) Int. Cl.
*H01L 29/786* (2006.01)
*H10K 50/11* (2023.01)
*H10K 50/81* (2023.01)
*H10K 50/82* (2023.01)
*H10K 50/824* (2023.01)
*H10K 50/84* (2023.01)
*H10K 59/124* (2023.01)
*H10K 59/131* (2023.01)
*H10K 71/00* (2023.01)
*H10K 59/121* (2023.01)
*H10K 59/126* (2023.01)

(52) U.S. Cl.
CPC .... *H01L 29/78633* (2013.01); *H01L 29/7869* (2013.01); *H10K 50/11* (2023.02); *H10K 50/81* (2023.02); *H10K 50/82* (2023.02); *H10K 50/824* (2023.02); *H10K 50/84* (2023.02); *H10K 59/124* (2023.02); *H10K 59/131* (2023.02); *H10K 71/00* (2023.02); *H10K 59/1213* (2023.02); *H10K 59/126* (2023.02)

(58) Field of Classification Search
CPC .... H10K 59/124; H10K 59/131; H10K 71/00; H10K 59/1213; H10K 59/126; H10K 59/1201; H01L 27/1225; H01L 27/124; H01L 29/78633; H01L 29/7869
See application file for complete search history.

(56) References Cited

U.S. PATENT DOCUMENTS

| | | | |
|---|---|---|---|
| 11,430,840 B2* | 8/2022 | Kang | ................... H10K 71/00 |
| 2015/0144922 A1 | 5/2015 | Moon et al. | |
| 2015/0187959 A1 | 7/2015 | Yoon | |
| 2016/0013438 A1 | 1/2016 | Im et al. | |
| 2016/0043341 A1 | 2/2016 | Heo et al. | |
| 2016/0149155 A1 | 5/2016 | Kim | |
| 2017/0062755 A1 | 3/2017 | Im et al. | |
| 2017/0125507 A1 | 5/2017 | Lee et al. | |
| 2017/0186831 A1 | 6/2017 | Nam et al. | |
| 2017/0194403 A1 | 7/2017 | Jung | |
| 2017/0317154 A1 | 11/2017 | Heo | |
| 2018/0097047 A1 | 4/2018 | Jung et al. | |
| 2018/0373079 A1* | 12/2018 | Yeh | ................... G02F 1/133345 |

FOREIGN PATENT DOCUMENTS

| | | |
|---|---|---|
| CN | 107039491 A | 8/2017 |
| KR | 10-2008-0051220 A | 6/2008 |
| KR | 10-2015-0061756 A | 6/2015 |
| KR | 10-2015-0075687 A | 7/2015 |
| KR | 10-2016-0006110 A | 1/2016 |
| KR | 10-2016-0047052 A | 5/2016 |
| KR | 10-2016-0056487 A | 5/2016 |
| KR | 10-2016-0062646 A | 6/2016 |
| KR | 10-2016-0074333 A | 6/2016 |
| KR | 10-2016-0127459 A | 11/2016 |
| KR | 10-2017-0015829 A | 2/2017 |
| KR | 10-2017-0026014 A | 3/2017 |
| KR | 10-2017-0050171 A | 5/2017 |

OTHER PUBLICATIONS

Office Action issued in corresponding Korean Patent Application No. 10-2022-0134931 dated Jun. 9, 2023. Note: KR 10-2016-0127459 and KR 10-2015-0075687 cited therein are already of record.

Office Action issued in corresponding Chinese Patent Application No. 201811184194.X dated Oct. 11, 2022.

Office Action dated Apr. 18, 2019, issued in corresponding Taiwanese Patent Application No. 107135959.

Office Action issued on Dec. 16, 2023 in Korean Patent Application No. 10-2022-0134931 Note: KR 10-2016-0127459, KR 10-2015-0061756, and KR 10-2015-0075687 cited therein are already of record.

* cited by examiner

LARGE AREA ORGANIC LIGHT-EMITTING DIODE DISPLAY

This application is a continuation application of U.S. patent application Ser. No. 16/154,956, filed Oct. 10, 2018, which claims the benefit of Korea Patent Application No. 10-2017-0134268 filed on Oct. 16, 2017, both of which are incorporated herein by reference for all purposes as if fully set forth herein.

BACKGROUND

Technical Field

The present disclosure relates to a large area organic light-emitting diode (OLED) display, and more particularly, to an OLED display including an auxiliary cathode for reducing the sheet resistance of a cathode and having an undercut structure for directly connecting the auxiliary cathode to the cathode.

Related Art

Nowadays, various flat panel display devices are developed for overcoming many drawbacks of the cathode ray tube such as heavy weight and bulk volume. Such flat panel display devices include the liquid crystal display (LCD), the field emission display (FED), the plasma display panel (PDP) and the electro-luminescence device (EL).

Electro-luminescence devices are classified into an inorganic Electro-luminescence device and an organic light-emitting diode (OLED) display according to the material of an emission layer and are spontaneously emitting devices having a high response speed, emission efficiency and luminance and a wide viewing angle. Particularly, the OLED display which has high energy efficiency and small leakage current and easily represents gradation through current control is increasingly required.

In the OLED display, cathodes maintaining a ground voltage are formed on the overall surface of a substrate of a display panel. Although there is no significant problem when the cathodes are formed of a metal material having a low resistivity value, when the cathodes are formed of a transparent conductive material in order to secure transmissivity, the sheet resistance increases and thus a problem may be generated with respect to picture quality.

For example, when cathodes contain a transparent conductive material or indium-tin oxide or indium-zinc oxide having larger resistivity than metals likes cathodes in top emission type displays, the sheet resistance of the cathodes increases. Then, the cathodes do not have a uniform voltage value over the overall area of the display panel. Particularly, in the case of a large area OLED display, luminance of the display may become ununiform over the overall screen, which is a very important issue.

SUMMARY

Accordingly, embodiments of the present disclosure are directed to a large area organic light-emitting diode display that substantially obviates one or more of the problems due to limitations and disadvantages of the related art.

An aspect of the present disclosure is to provide a large area OLED display including a cathode and an auxiliary cathode directly connected to each other to reduce sheet resistance, thereby achieving high display quality. Another aspect of the present disclosure is to provide a larger area OLED display capable of simplifying a manufacturing process while including auxiliary cathodes.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an organic light-emitting diode (OLED) display comprises a substrate, an auxiliary connection line, an auxiliary cathode, a passivation layer, an overcoat layer, a connection terminal, an undercut opening, a bank, an organic emission layer and a cathode. The auxiliary connection line may be disposed on the substrate. The auxiliary cathode may be disposed on the auxiliary connection line and connected to the auxiliary connection line. The passivation layer may cover the auxiliary cathode. The overcoat layer may be formed on the passivation layer. The connection terminal may be connected to the auxiliary cathode on the overcoat layer. The undercut opening may be formed on the overcoat layer to expose a portion of the auxiliary cathode, an under area is located in the undercut opening and disposed under one side of the connection terminal. The bank may have a size larger than the undercut opening and exposes the entire undercut opening. The organic emission layer may be formed on a region other than the under area in the undercut opening to expose the portion of the auxiliary cathode. The cathode may be directly connected to the exposed portion of the auxiliary cathode on which the organic emission layer may be not formed in the under area of the undercut opening.

For example, the overcoat layer may include an over-etched stepped portion formed at a portion of the upper part thereof exposed by the bank.

For example, the OLED display may further include a light-shielding layer, a thin film transistor, a pixel contact hole and an anode. The light-shielding layer may be disposed on the substrate at the same level as the auxiliary connection line. The thin film transistor may be disposed on the light-shielding layer and under the passivation layer. The pixel contact hole may be formed in the overcoat layer and selectively exposes the thin film transistor. The anode may be connected to the thin film transistor through the pixel contact hole on the overcoat layer. The bank may define an emission area exposing the center portion of the anode. The organic emission layer is formed on the entire emission area. The cathode may be formed on the organic emission layer in the emission area. The anode, the organic emission layer and the cathode may be laminated to form an organic light-emitting diode (OLED) in the emission area.

For example, the OLED display may further include a buffer layer covering the light-shielding layer and the auxiliary connection line. The thin film transistor may include a semiconductor layer, a gate electrode, an interlayer insulating layer, a source electrode and a drain electrode. The semiconductor layer may be disposed on the buffer layer located on the light-shielding layer. The gate electrode may be superposed on the center region of the semiconductor layer having a gate insulating layer interposed therebetween. The interlayer insulating layer may cover the gate electrode and the semiconductor layer. The source electrode may be connected to one side of the semiconductor layer on the interlayer insulating layer. The drain electrode may be connected to the other side of the semiconductor layer on the interlayer insulating layer.

For example, the OLED display may further include a buffer layer, an interlayer insulating layer and a drain electrode. The buffer layer may cover the light-shielding layer and the auxiliary connection line. The interlayer insulating layer may be formed on the buffer layer. The drain electrode may be included in the thin film transistor disposed on the interlayer insulating layer. The auxiliary cathode may include the same material as the drain electrode on the interlayer insulating layer.

For example, the undercut opening may include one side and the other side. The one side may expose an etched side wall of the overcoat layer and an etched side wall of the passivation layer. The other side may expose the connection terminal. A portion of the passivation layer under the connection terminal may be over-etched to expose a portion of the connection terminal at the other side of the undercut opening.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

The advantages, features and methods for accomplishing the same of the present invention will become more apparent through the following detailed description with respect to the accompanying drawings. However, the present invention is not limited by embodiments described blow and is implemented in various different forms, and the embodiments are provided so that this disclosure will be thorough and complete, and will fully convey the scope of the invention to those skilled in the art. The present invention is defined by the scope of the claims.

Shapes, sizes, ratios, angles, numbers, etc. shown in the figures to describe embodiments of the present invention are exemplary and thus are not limited to particulars shown in the figures. Like numbers refer to like elements throughout the specification.

In describing the present invention, if a detailed description of known techniques associated with the present invention would unnecessarily obscure the gist of the present invention, detailed description thereof will be omitted. It will be further understood that when the terms "include", "have" and "comprise" are used in this specification, other parts may be added unless "~ only" is used. An element described in the singular form is intended to include a plurality of elements unless context clearly indicates otherwise.

In interpretation of a component, the component is interpreted as including an error range unless otherwise explicitly described. It will be understood that, when an element is referred to as being "on" or "under" another element, it can be "directly" on or under another element or can be "indirectly" formed such that an intervening element is also present.

In the following description of the embodiments, "first" and "second" are used to describe various components, but such components are not limited by these terms. The terms are used to discriminate one component from another component. Accordingly, a first component mentioned in the following description may be a second component within the technical spirit of the present invention.

Features of embodiments of the present invention can be coupled or combined partially or overall and technically interoperated in various manners, and the embodiments may be implemented independently or associatively.

Hereinafter, embodiments of the present disclosure will be described in detail with reference to the attached drawings. The following embodiments focus on OLED displays including organic emission materials as electro-luminescence displays. However, the technical scope of the present invention is not limited to the OLED displays and is also applicable to inorganic light-emitting diode displays including inorganic emission materials.

First Embodiment

Figure 1:
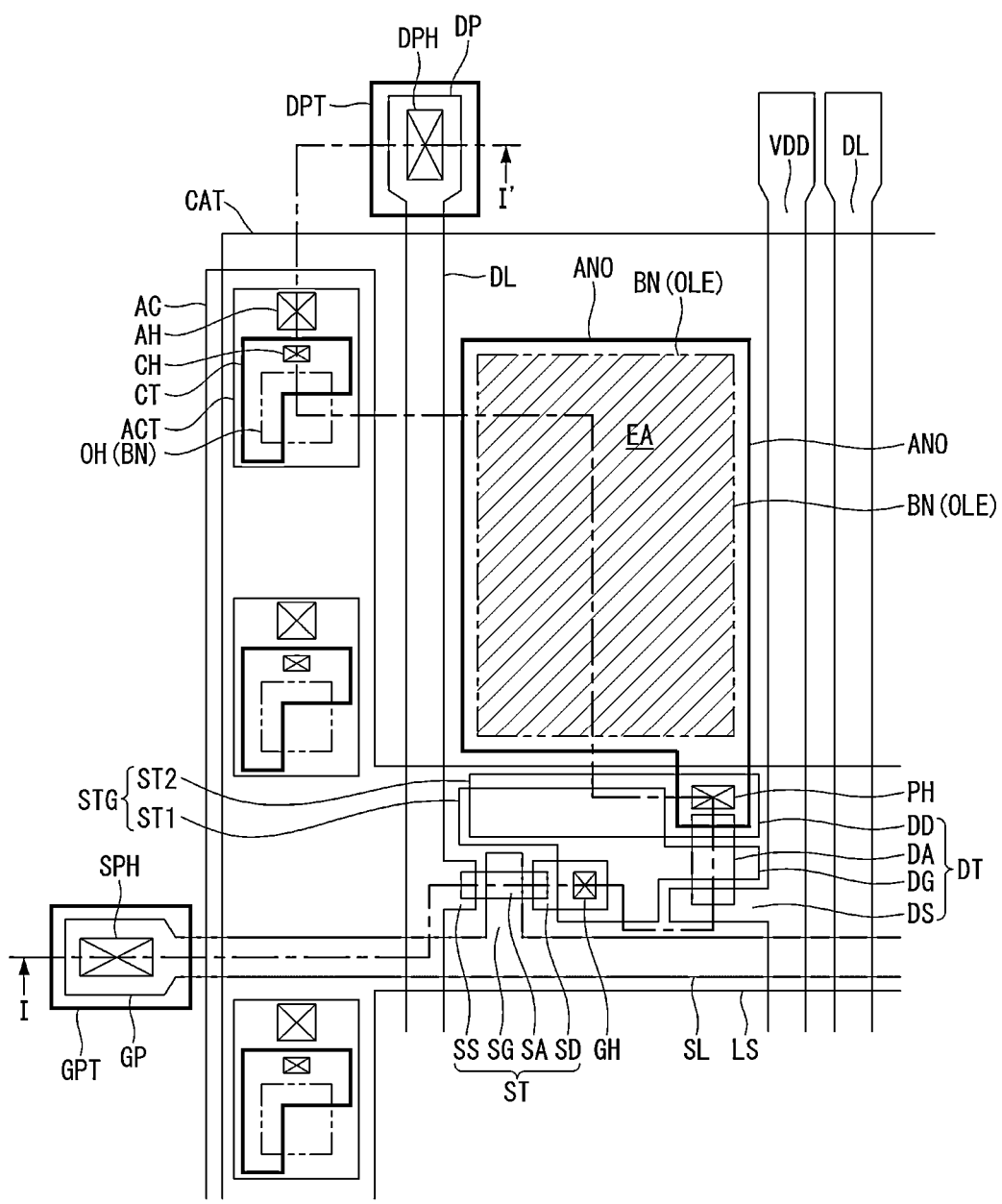
FIG. 1 is a plan view showing a structure of an OLED display according to an example embodiment of the present invention.
Figure 2:
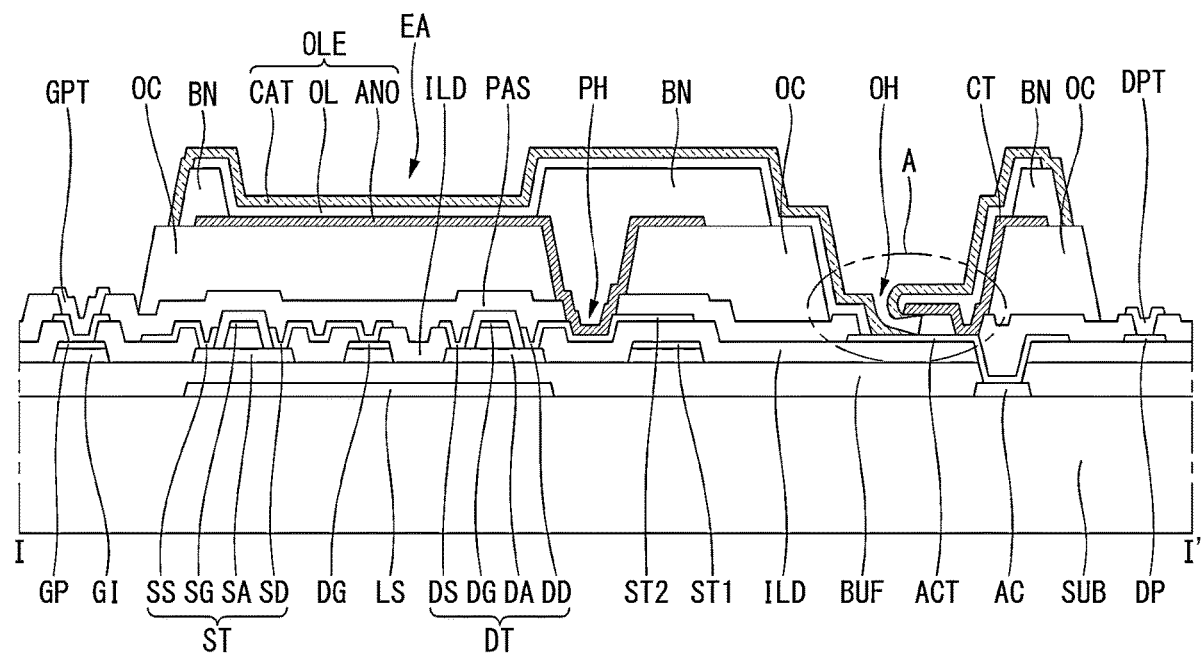
FIG. 2 is a cross-sectional view showing a structure of an OLED display according to a first embodiment of the present invention, taken along line I-I' of FIG. 1.

A structure of an OLED display according to a first embodiment of the present invention will be described with reference to FIGS. 1 and 2. FIG. 1 is a plan view showing a structure of the OLED display according to the present invention and FIG. 2 is a cross-sectional view showing the structure of the OLED display according to the first embodiment of the present invention, taken along line I-I' of FIG. 1.

The OLED display according to the present invention includes a plurality of pixel regions arranged in a matrix on a substrate SUB. The OLED display includes scan lines SL extended in the horizontal direction and data lines DL and driving current lines VDD extended in the vertical direction on the substrate SUB. The pixel regions are defined by intersection of the scan lines SL, the data lines DL and the driving current lines VDD. The scan lines SL is connected to a gate pad terminal GPT and the data lines DL is connected to a data pad terminal DPT. The gate pad terminal GPT has a gate pad GP and a gate pad contact hole GPH. The data pad terminal DPT has a data pad DP and a data pad contact hole DPH. For example, the gate pad terminal GPT and data pad terminal DPT are formed of a metal oxide such as ITO or IZO but not limit thereto.

An organic light-emitting diode OLE and thin film transistors (TFTs) which are driving elements for driving the organic light-emitting diode OLE are disposed in each pixel region. The TFTs include a switching TFT ST and a driving TFT DT. The switching TFT ST includes a switching gate electrode SG, a switching semiconductor layer SA, a switching source electrode SS and a switching drain electrode SD. The switching gate electrode SG is connected to a corresponding scan line SL. The switching gate electrode SG is superposed on the center portion of the switching semiconductor layer SA having a gate insulating layer GI formed therebetween. The switching source electrode SS and the switching drain electrode SD are disposed on both sides of the switching gate electrode SG and respectively connected to both sides of the switching semiconductor layer SA.

The driving TFT DT includes a driving gate electrode DG, a driving semiconductor layer DA, a driving source electrode DS and a driving drain electrode DD. The driving gate electrode DG is connected to the switching drain electrode SD. The driving gate electrode DG is superposed on the center portion of the driving semiconductor layer DA having a gate insulating layer GI formed therebetween. The driving source electrode DS and the driving drain electrode DD are disposed on both sides of the driving gate electrode DG and respectively connected to both sides of the driving semiconductor layer DA.

The organic light-emitting diode OLE includes an anode ANO, an organic emission layer OL and a cathode CAT. The anode ANO is connected to the driving TFT DT. The organic emission layer OL is laminated on the anode ANO. Particularly, an emission area EA in the anode ANO is defined as open by a bank BN. The organic emission layer OL is formed on the overall surface of the substrate SUB and contacts the anode ANO in the emission area EA. The cathode CAT is laminated on the organic emission layer OL. The cathode CAT is also formed on the overall surface of the substrate SUB. The anode ANO, the organic emission layer OL and the cathode CAT are sequentially laminated in the emission area EA to form the organic light-emitting diode OLE.

In the case of a top emission type OLED display, light is emitted from the anode ANO toward the cathode CAT in FIG. 2. Accordingly, it is desirable that the anode ANO include an opaque metal material and the cathode CAT include a transparent conductive material. The cathode CAT is an electrode maintaining a ground voltage in the organic light-emitting diode OLE and it is desirable that the cathode CAT maintain a uniform voltage. When the cathode CAT includes a transparent conductive material such as indium-tin oxide or indium-zinc oxide having considerably higher resistivity than metals, it is difficult to maintain a uniform ground voltage in a large area OLED display. Accordingly, it is desirable to form an auxiliary connection line AC and/or an auxiliary cathode ACT and connect the auxiliary connection line AC and/or the auxiliary cathode ACT to the cathode CAT to reduce sheet resistance.

To this end, the present invention further includes auxiliary connection lines AC, auxiliary cathodes ACT and connection terminals CT disposed in a non-emission area surrounding the emission area EA. The auxiliary connection lines AC may be formed of the same metal material as a light-shielding layer LS disposed under the TFTs ST and DT at the same level as the light-shielding layer LS. The auxiliary cathodes ACT may be formed of the same material as the source and drain electrodes of the TFTs ST and DT at the same level as the source and drain electrodes. The connection terminals CT may be formed of the same material as the anodes ANO at the same level as the anodes ANO.

The auxiliary connection lines AC may be formed separately from the light-shielding layer LS or may be connected to the light-shielding layer LS to form a mesh shape on the substrate SUB. A buffer layer BUF is formed on the auxiliary connection lines AC. The auxiliary cathodes ACT may be formed of the same materials as the source and drain electrodes of the TFTs ST and DT formed on the buffer layer BUF at the same level as the source and drain electrodes separately therefrom. In this case, the auxiliary cathodes ACT are connected to the auxiliary connection lines AC through auxiliary connection line contact holes AH which penetrate an interlayer insulating layer ILD and the buffer layer BUF.

A passivation layer PAS is formed on the auxiliary cathodes ACT. An overcoat layer OC is formed on the passivation layer PAS. In addition, the connection terminals CT for connection with the anodes ANO are formed on the overcoat layer OC. Each auxiliary cathode ACT and each connection terminal CT may be physically connected to each other directly or indirectly. Here, a structure in which each auxiliary cathode ACT and each connection terminal CT are directly connected to each other is described. The connection terminal CT is connected to the auxiliary cathode ACT through a connection contact hole CH formed in the passivation layer PAS.

Figure 3:
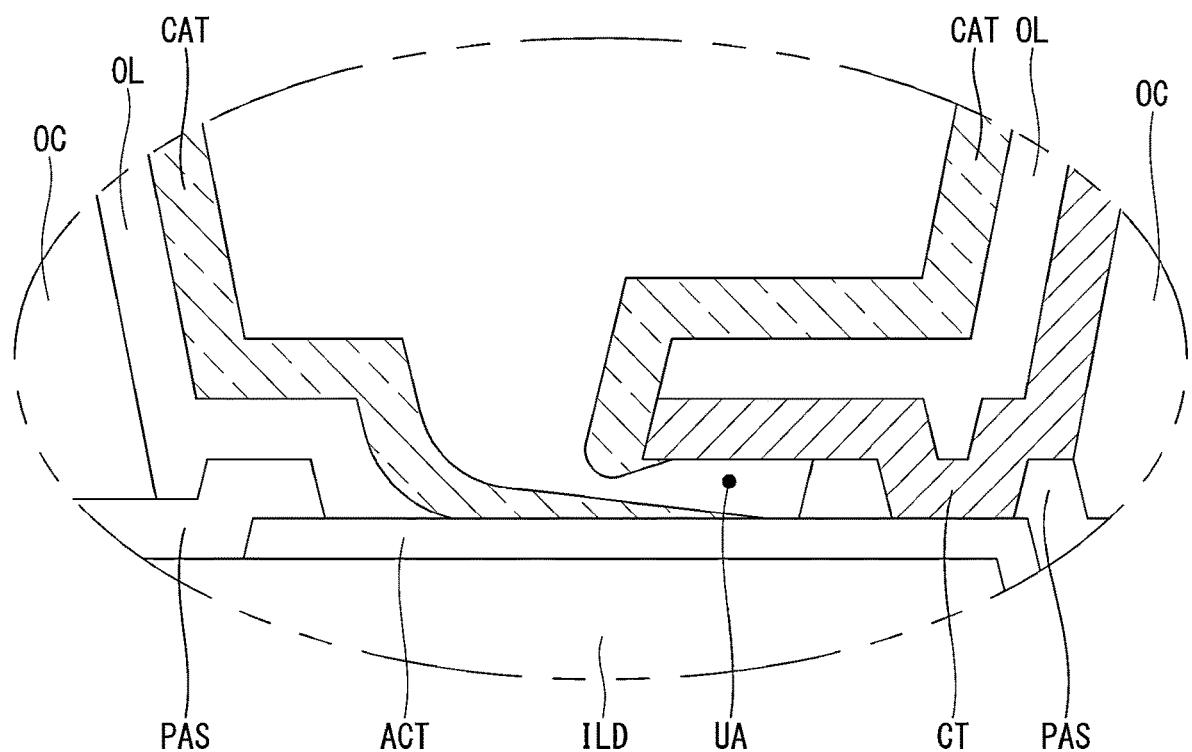
FIG. 3 is an enlarged cross-sectional view showing a structure A of an undercut opening to which a cathode and an auxiliary cathode are connected in FIG. 2.

The auxiliary cathode ACT is partially exposed through an undercut opening OH which penetrates the overcoat layer OC and the passivation layer PAS. One side of the undercut opening OH is exposed and the other side thereof is covered with the connection terminal CT. Only the other side of the undercut opening OH is covered with the connection terminal CT in order to over-etch the passivation layer PAS formed thereunder using the connection terminal CT to form an under area UA (see FIG. 3).

The undercut opening OH may have a polygonal shape. Although FIG. 1 shows a square, the present invention is not limited thereto. For example, the undercut opening OH may have one side and the other side facing the one side. The one side is a portion exposing an etched side wall of the overcoat layer OC and an etched side wall of the passivation layer PAS. The other side is a portion at which the connection terminal CT is disposed. Particularly, the connection terminal CT is exposed at the other side of the undercut opening OH.

The passivation layer PAS is removed in the undercut opening OH. Particularly, a portion of the passivation layer PAS formed under the connection terminal CT is partially over-etched at the other side of the undercut opening OH and thus the bottom surface of the connection terminal CT is partially exposed. A cave-shaped space formed according to over-etch of the passivation layer PAS under the connection terminal CT in the undercut opening OH is defined as the under area UA.

While the passivation layer PAS is partially removed to expose part of the auxiliary cathode ACT in the under area UA, the under area UA is covered by the connection terminal CT such that the organic emission layer OL is not formed in the under area UA. When the cathode CAT is formed, the material of the cathode CAT is also deposited in the under area UA and thus the cathode CAT is directly connected to the auxiliary cathode ACT. The connection structure of the cathode CAT and the auxiliary cathode ACT through the under area UA is enlarged and shown in FIG. 3.

The organic emission layer OL is formed by heating and depositing an organic material through thermal deposition and thus is not formed in the under area UA covered by the connection terminal CT. On the contrary, a metal oxide such as ITO or IZO is deposited through sputtering and thus is also deposited in the under area UA covered by the connection terminal CT.

Furthermore, the organic emission layer OL is formed only on the upper surface of the connection terminal CT. The cathode CAT is formed on the lower surface of the connection terminal CT covering the under area UA and thus connection terminal CT is physically and electrically connected to the cathode CAT.

That is, in the OLED display according to the present invention, the cathode CAT is connected to the auxiliary cathode ACT and the connection terminal CT in the undercut opening. In addition, the auxiliary cathode ACT is connected to the auxiliary connection line AC. Accordingly, the sheet resistance of the cathode CAT formed of a transparent conductive material having high resistivity can be reduced according to the auxiliary cathode ACT and the auxiliary connection line AC formed of a metal material having considerably low resistivity.

Hereinafter, manufacturing processes of the OLED display according to the first embodiment of the present invention will be described with reference to FIGS. 4A to 4H and 5A to 5C.

Figure 4A:
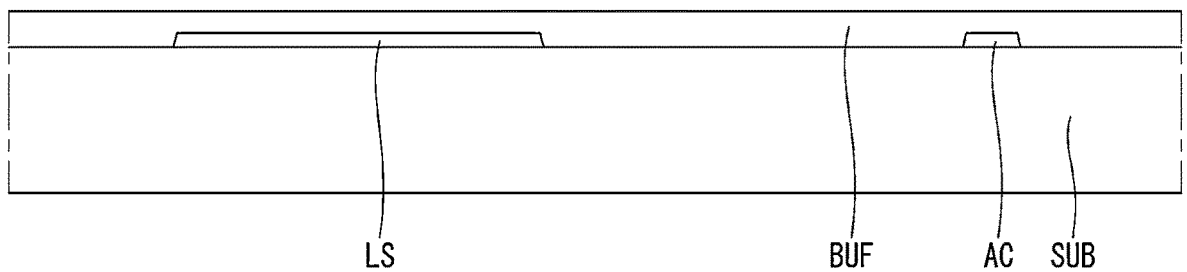
FIGS. 4A to 4H are cross-sectional views showing some of manufacturing processes of the OLED display according to an example embodiment of the present invention.
Figure 4B:
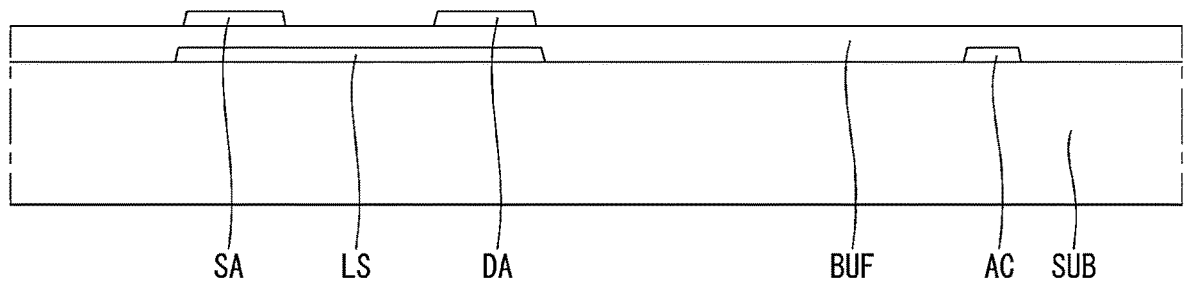
Figure 4C:
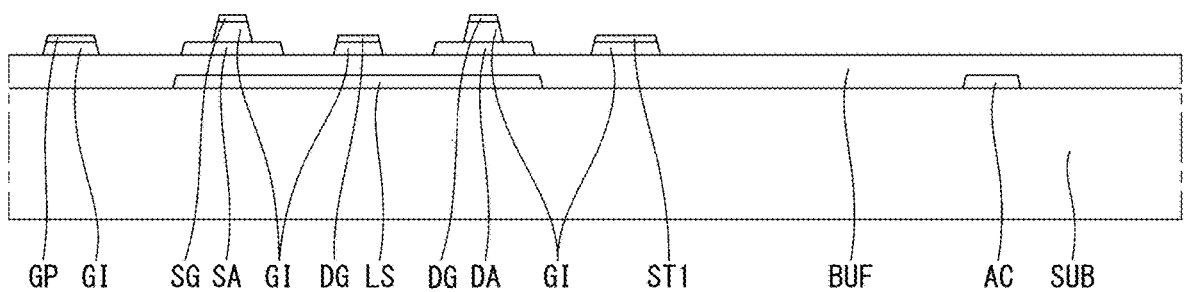
Figure 4D:
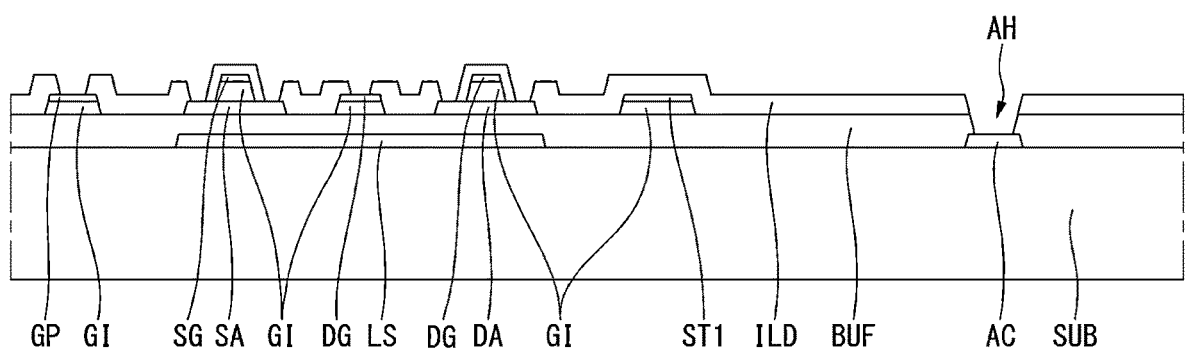
Figure 4E:
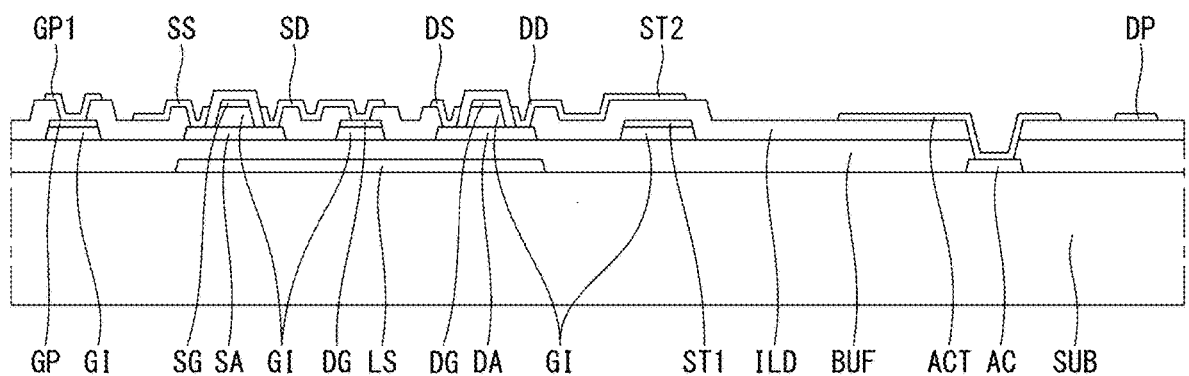
Figure 4F:
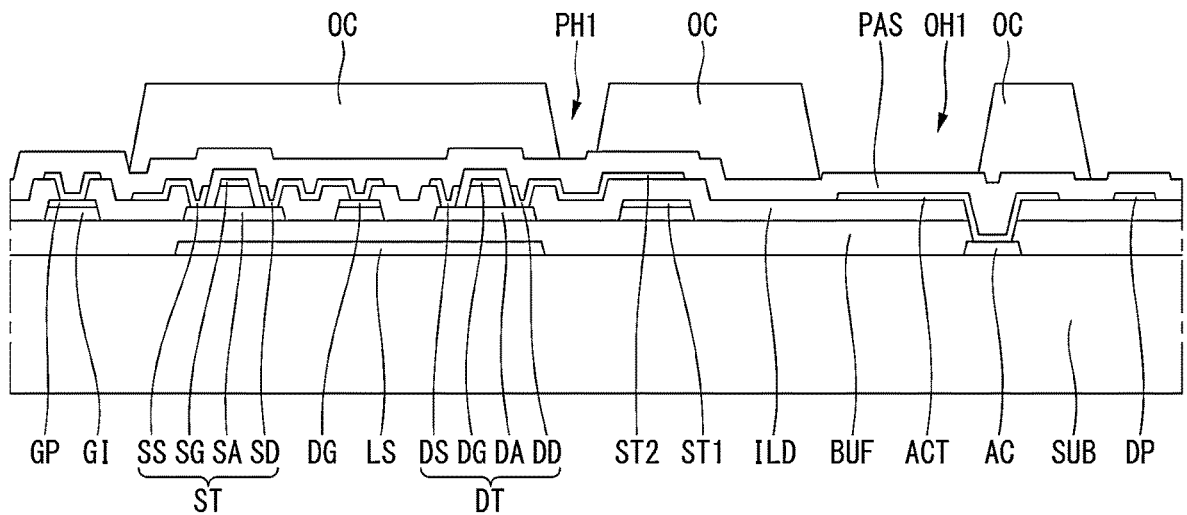
Figure 4G:
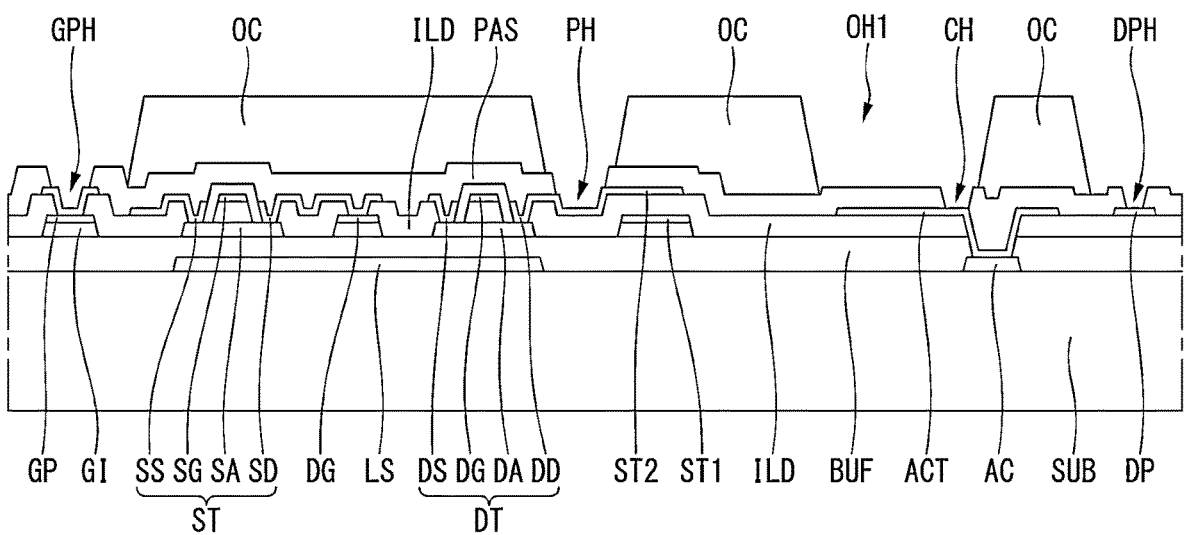
Figure 4H:
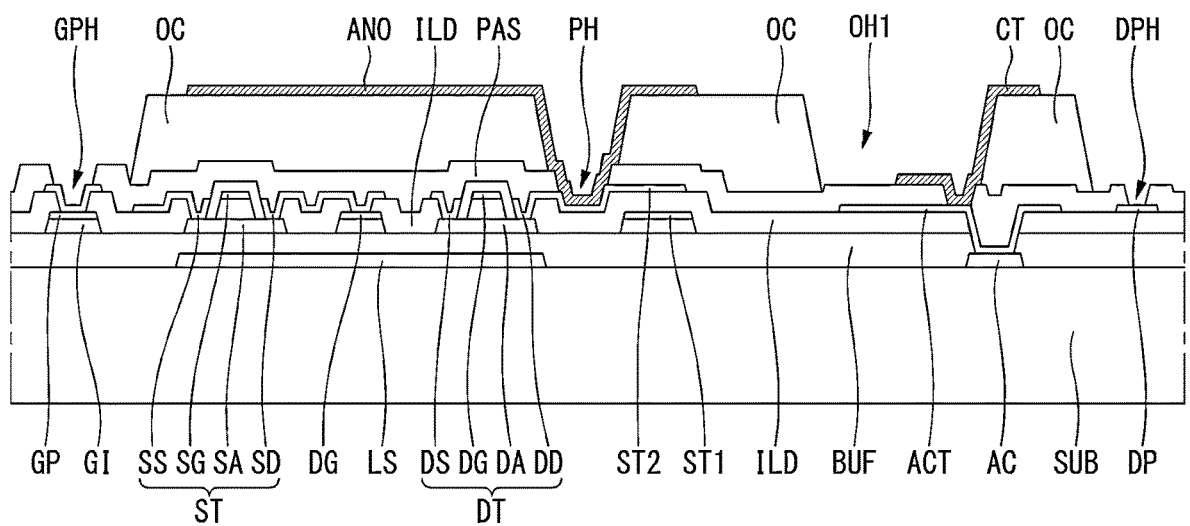
Figure 5A:
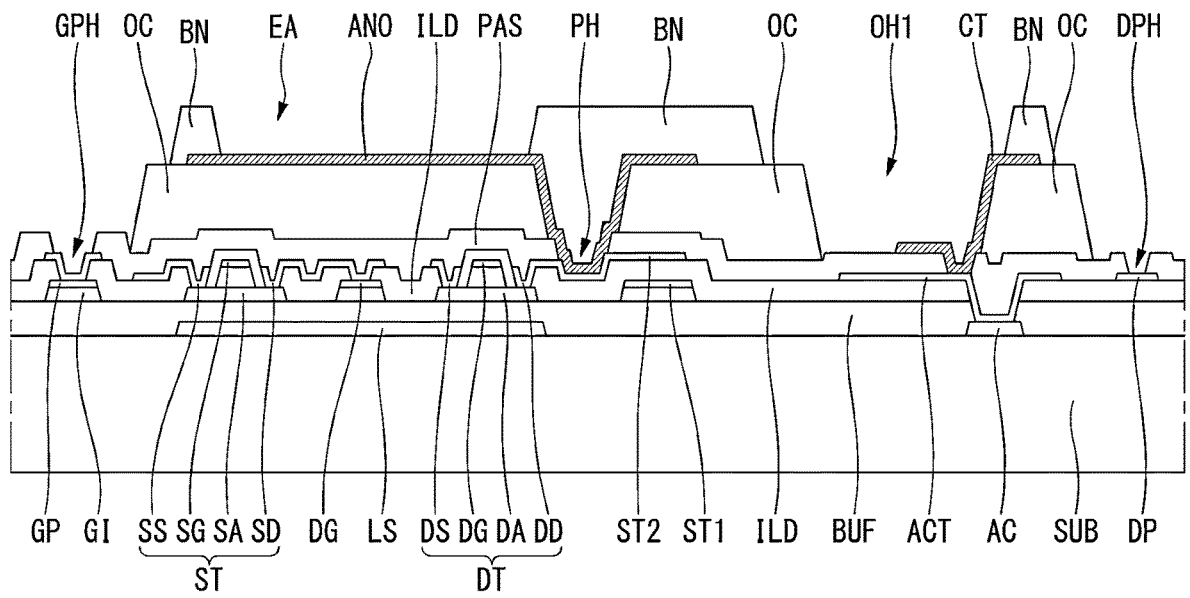
FIGS. 5A to 5C are cross-sectional views showing manufacturing processes of the OLED display according to the first embodiment of the present invention.
Figure 5B:
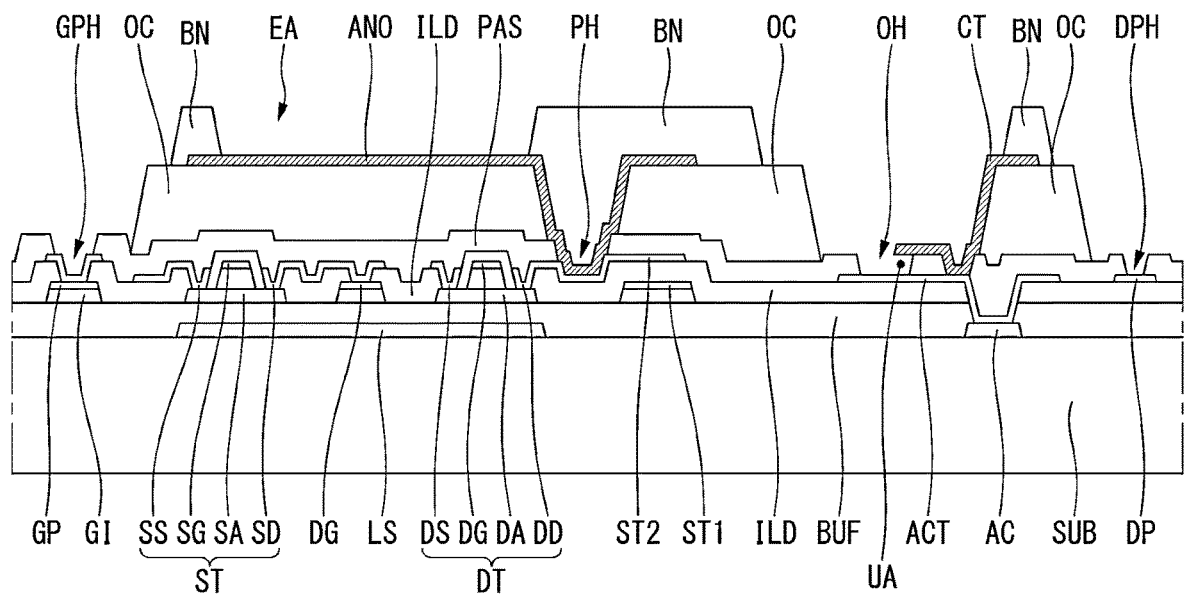
Figure 5C:
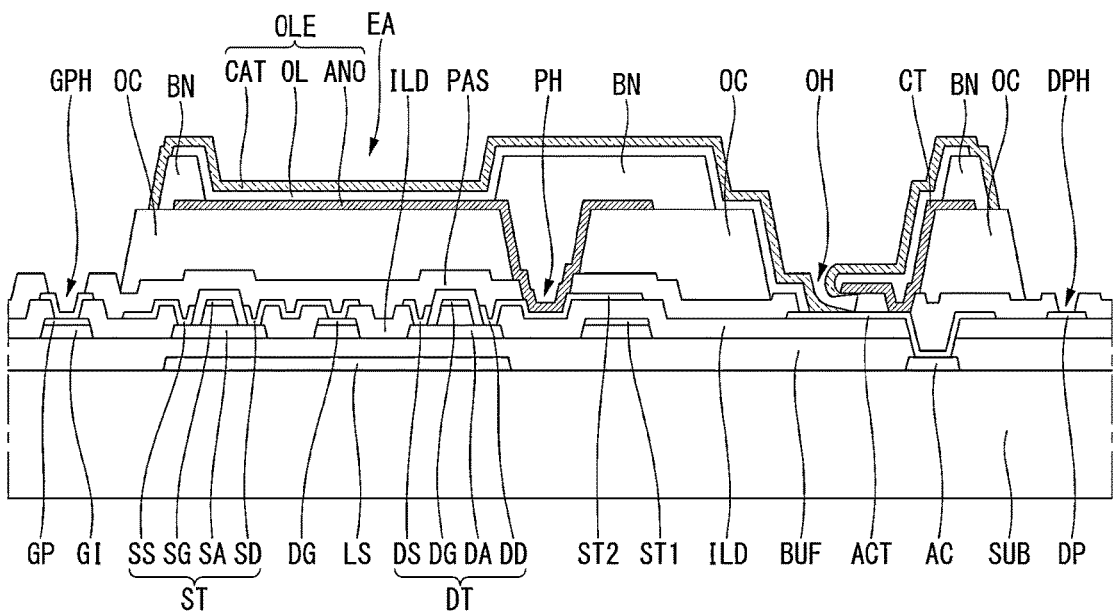

FIGS. 4A to 4H are cross-sectional views showing some of the manufacturing processes of the OLED display according to the present invention. FIGS. 5A to 5C are cross-sectional views showing manufacturing processes of the OLED display according to the first embodiment of the present invention. FIGS. 4A to 4H show common processes among manufacturing processes of OLED displays according to various embodiments of the present invention. That is, processes of FIGS. 4A to 4H are commonly used and subsequent processes are different in various embodiments of the present invention.

An opaque metal material is coated on the substrate SUB. The metal material layer is patterned through a first mask process to form the light-shielding layer and the auxiliary connection line AC. The buffer layer BUF is formed on the overall surface of the substrate SUB having the light-shielding layer LS and the auxiliary connection line AC formed thereon. The light-shielding layer LS is disposed at a position at which TFTs will be formed. For example, the light-shielding layer LS may have a strip shape extended in the horizontal direction of the substrate SUB. The auxiliary connection line AC may have a strip shape extended in the horizontal direction or vertical direction of the substrate SUB. The auxiliary connection line AC may be separate from the light-shielding layer LS or connected thereto. Here, a case in which the auxiliary connection line AC is connected to the light-shielding layer LS and extended in the vertical direction of the substrate SUB is described (FIG. 4A).

A semiconductor material is coated on the buffer layer BUF and patterned through a second mask process to form a semiconductor layer. The semiconductor layer includes the switching semiconductor layer SA of the switching TFT ST and the driving semiconductor layer DA of the driving TFT DT (FIG. 4B).

The gate insulating layer GI and a metal layer are sequentially formed on the overall surface of the substrate SUB having the semiconductor layer SA and DA formed thereon. The metal layer and the gate insulating layer GI are simultaneously patterned through a third mask process to form the scan line SL, a Gate pad GP, a first auxiliary capacitor electrode ST1 and gate electrodes. The gate electrodes include the switching gate electrode SG of the switching TFT ST and the driving gate electrode DG of the driving TFT DT. The switching gate electrode SG is superposed on the center of the switching semiconductor layer SA having the gate insulating layer GI formed therebetween. The driving gate electrode DG is superposed on the center of the driving semiconductor layer DA having the gate insulating layer GI formed therebetween (FIG. 4C).

The interlayer insulating layer ILD is formed on the overall surface of the substrate SUB having the scan line SL, the Gate pad GP and the gate electrodes SG and DG formed thereon and patterned through a fourth mask process to form contact holes AH. The contact holes respectively expose one side and the other side of the switching TFT ST, one side and the other side of the driving TFT DT. In addition, the contact holes expose part of the driving gate electrode DG. Further, the contact holes penetrate the interlayer insulating layer ILD and the buffer layer BUF to expose part of the auxiliary connection line AC (FIG. 4D).

A metal material is coated on the interlayer insulating layer ILD having the contact holes formed therein and patterned through a fifth mask process to form the data line DL, the driving current line VDD, the auxiliary cathode ACT, a second auxiliary capacitor electrode ST2 and source and drain electrodes. The source and drain electrodes include the switching source electrode SS, the switching drain electrode SD, the driving source electrode DS and the driving drain electrode DD. The switching source electrode SS is branched off from the data line DL. The driving source electrode DS is branched off from the driving current line VDD. A data pad DP is disposed at an end of the data line DL and a driving pad is disposed at an end of the driving current line VDD. In addition, a gate pad connection terminal GP1 is connected to a gate pad GP. The second auxiliary capacitor electrode ST2 is extended from the driving drain electrode DD and superposed on the first auxiliary capacitor electrode ST1 having the interlayer insulating layer ILD formed therebetween (FIG. 4E).

The passivation layer PAS is formed on the overall surface of the substrate SUB having the source and drain electrodes formed thereon and the overcoat layer OC is formed on the passivation layer PAS. The overcoat layer OC is patterned through a sixth mask process to form a first pixel contact hole PH1 and a first undercut opening OH1. Here, it is desirable to remove the passivation layer PAS on the gate pad GP and the data pad DP. The first undercut opening OH1 is formed to expose the auxiliary cathode ACT, and it is desirable to form the first undercut opening OH1 in a non-emission area in which the OLED is not disposed (FIG. 4F).

The exposed passivation layer PAS is patterned through a seventh mask process to form a gate pad contact hole GPH, a data pad contact hole DPH, a pixel contact hole PH and a connection contact hole CH. The gate pad contact hole GPH exposes the gate pad connection terminal GP1. The data pad contact hole DPH exposes the data pad DP. The pixel contact hole PH exposes part of the driving drain electrode DD. The connection contact hole CH exposes part of the auxiliary cathode ACT (FIG. 4G).

A metal material is deposited on the overall surface of the substrate SUB on which the partially removed overcoat layer OC has been formed. The metal material layer is patterned through an eighth mask process to form the anode ANO and the connection terminal CT. The anode ANO has a shape occupying almost entire area of the center of the pixel region. The connection terminal CT may be formed on the overcoat layer OC while covering one side of the first undercut opening OH1. The connection terminal CT is not formed at the other side of the first undercut opening OH1 and thus the passivation layer PAS is exposed at the other side of the first undercut opening OH1. The connection terminal CT is connected to the auxiliary cathode ACT through the connection contact hole CH (FIG. 4H).

Subsequent processes will be described with reference to FIGS. 5A to 5C. An organic material is coated on the substrate SUB on which the anode ANO and the connection terminal CT have been formed. The organic material layer is patterned through a ninth mask process to form the bank BN. The bank BN exposes the greater part of the anode ANO to define the emission area EA. In addition, the bank BN exposes the entire first undercut opening OH1. That is, the bank BN has an open region smaller than the anode ANO and an open region larger than the first undercut opening OH1 (FIG. 5A).

The portion of the passivation layer PAS exposed in the first undercut opening OH1 is etched through a tenth mask process to accomplish the undercut opening OH. Here, it is desirable that the mask used in the tenth mask process have an opening pattern covering part of the passivation layer PAS and part of the connection terminal CT in the first undercut opening OH1. Here, passivation layer etching time is controlled such that the portion of the passivation layer PAS disposed under the connection terminal CT is over-etched to have an undercut shape. The passivation layer PAS is selectively etched in the undercut opening OH to expose part of the auxiliary cathode ACT. In addition, the passivation layer is over-etched under the connection terminal CT to form the under area UA. The auxiliary cathode ACT is also exposed in the under area UA. Here, a gap corresponding to the thickness of the passivation layer PAS is formed between the connection terminal CT and the auxiliary cathode ACT and thus a cave-shaped void can be formed (FIG. 5B).

The organic emission layer OL is formed on the overall surface of the substrate SUB having the undercut opening OH formed thereon. The organic emission layer OL is formed by coating an organic material through thermal deposition. The organic emission layer OL is formed to cover the surface of the bank BN and the anode ANO. However, the organic emission layer OL is formed only on the exposed portion of the auxiliary cathode ACT on outer sides of the undercut opening OH. Particularly, the organic emission layer OL is not formed in the under area UA and thus the surface of the auxiliary cathode ACT is exposed in the under area UA.

After the organic emission layer OL is formed, a transparent conductive material is coated thereon to form the cathode CAT. The transparent conductive material includes indium-tin oxide (ITO) or indium-zinc oxide (IZO). The transparent conductive material is coated through sputtering. The transparent conductive material is deposited on the anode ANO and the organic emission layer OL in the emission area EA to form the organic light-emitting diode OLE.

When the cathode CAT is formed through sputtering, the cathode CAT is formed along the geometry of the surface thereunder. The transparent conductive material is deposited on a region in which the organic emission layer OL is not formed as well as the surface of the organic emission layer OL. That is, the transparent conductive material is deposited on the one side of the undercut opening OH at which the connection terminal CT is not formed along the inclined surface thereof and also deposited in the under area UA. As a result, the cathode CAT is physically connected to the portion of the auxiliary cathode ACT which is exposed because the organic emission layer OL is not formed thereon in the under area UA (FIG. 5C).

The OLED display according to the first embodiment describe above includes the auxiliary cathode ACT and the auxiliary connection line AC connected to the cathode CAT formed of a transparent conductive material using 10 mask processes. Particularly, the auxiliary cathode ACT contains the same metal material as the anode ANO and the auxiliary connection line AC contains the same metal material as the light-shielding layer LS. Accordingly, the sheet resistance of the cathode CAT having higher resistivity than metal materials can be reduced. Therefore, the cathode CAT can maintain low resistance even in a top emission type large area OLED display to prevent picture quality ununiformity.

Second Embodiment

Although the first embodiment can reduce the resistance of the cathode, additional mask processes for forming the undercut opening OH are required and thus processing time increases. In a second embodiment, manufacturing processes having simplified mask processes for forming an undercut opening for connecting the cathode CAT to the auxiliary cathode ACT is described.

In the manufacturing processes according to the second embodiment, processes until the anode ANO and the connection terminal CT are formed are identical to those in the first embodiment. That is, the processes corresponding to those of FIGS. 4A to 4H are identical to those of the first embodiment, and thus description thereof is omitted. The manufacturing processes according to the second embodiment will be described with reference to FIGS. 6A to 6D. FIGS. 6A to 6D are cross-sectional views showing manufacturing processes of an OLED display according to the second embodiment of the present invention. In processes of FIGS. 6A to 6D, a single mask process using a half-tone mask is performed.

Figure 6A:
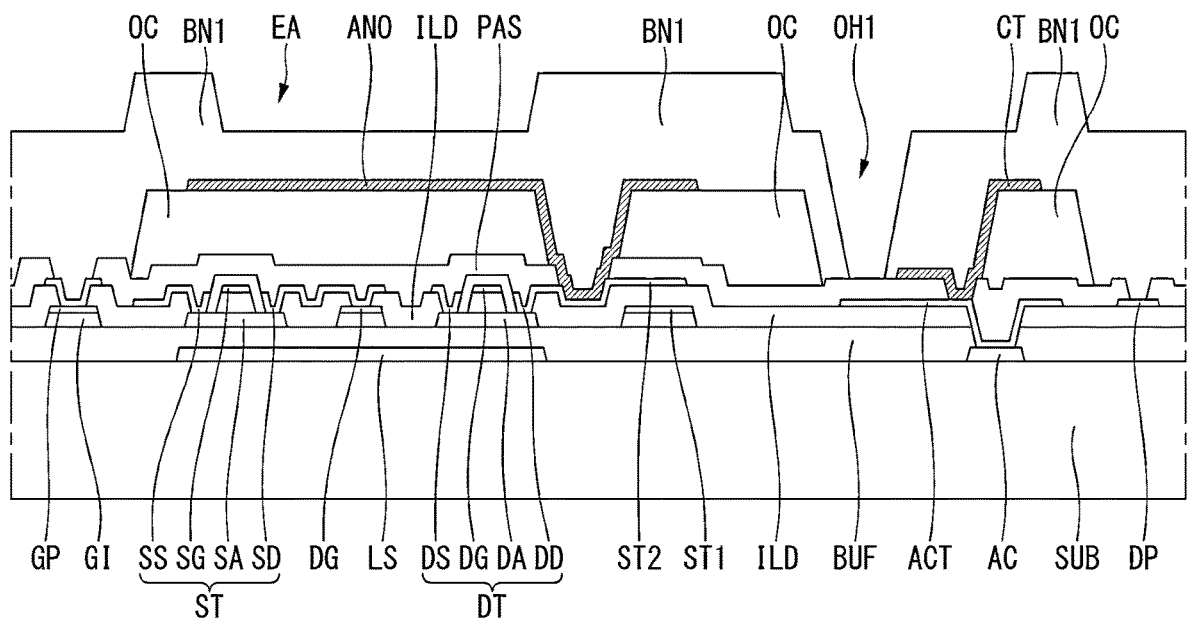
FIGS. 6A to 6D are cross-sectional views showing manufacturing processes of an OLED display according to a second embodiment of the present invention.

An organic material is coated on the overall surface of the substrate SUB on which the anode ANO and the connection terminal CT have been formed. The organic material layer is patterned through a ninth mask process to form a first bank BN1. Here, it is desirable that the ninth mask process uses a half-tone mask. That is, the portion of the first bank BN1 which corresponds to a region in which the undercut opening OH will be formed is removed, and the first bank BN1 having a first thickness in the emission area EA and a second thickness greater than the first thickness in the non-emission area is formed (FIG. 6A).

Figure 6B:
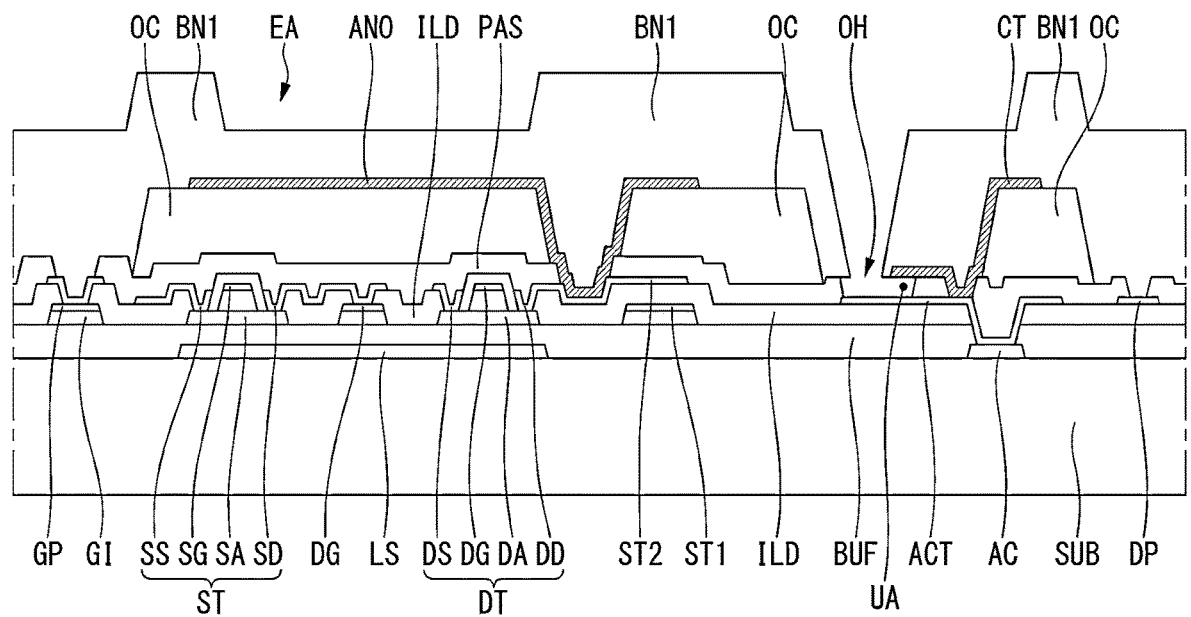

The portion of the passivation layer PAS exposed in the first undercut opening OH1 is etched using the first bank BN1 as a mask to form the undercut opening OH. Here, passivation layer etching time is controlled such that the portion of the passivation layer PAS disposed under the connection terminal CT is over-etched to have an undercut shape. The undercut opening OH formed by etching the passivation layer PAS exposes part of the auxiliary cathode ACT. Further, the passivation layer PAS is over-etched under the connection terminal CT to form the under area UA. The auxiliary cathode ACT is also exposed in the under area UA. Here, a gap corresponding to the thickness of the passivation layer PAS is formed between the connection terminal CT and the auxiliary cathode ACT and thus a cave-shaped void can be formed (FIG. 6B).

Figure 6C:
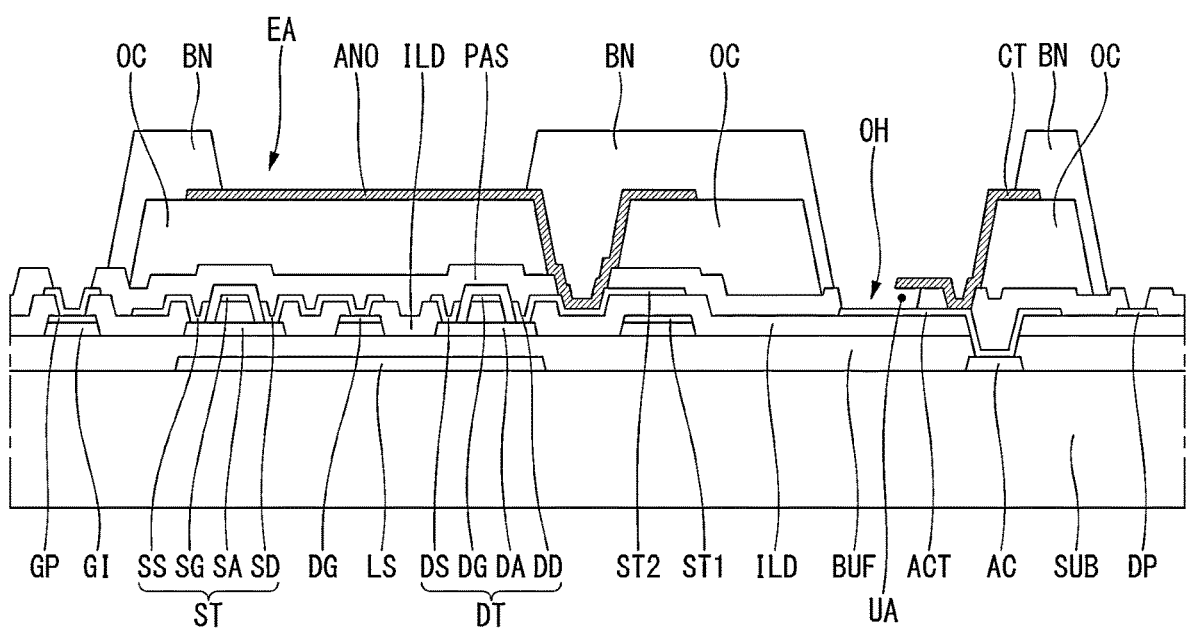

After formation of the undercut opening OH, ashing process is performed to thin the first bank BN1 to form the bank BN. Particularly, the portion of the first bank BN1 which corresponds to the emission area EA is removed to exposes the anode ANO. As a result, the bank BN remaining in the non-emission area has a thickness (second thickness–first thickness). The bank BN exposes the greater part of the anode ANO to define the emission area EA (FIG. 6C).

The organic emission layer OL is formed on the overall surface of the substrate SUB having the bank BN formed thereon. The organic emission layer OL is formed by coating an organic material through thermal deposition. The organic emission layer OL is formed to cover the surface of the bank BN and the anode ANO. However, the organic emission layer OL is formed only on the exposed portion of the auxiliary cathode ACT on outer sides of the undercut opening OH. Particularly, the organic emission layer OL is not formed in the under area UA and thus the surface of the auxiliary cathode ACT is exposed in the under area UA.

After the organic emission layer OL is formed, a transparent conductive material is coated thereon to form the cathode CAT. The transparent conductive material includes indium-tin oxide (ITO) or indium-zinc oxide (IZO). The transparent conductive material is coated through sputtering. The transparent conductive material is deposited on the anode ANO and the organic emission layer OL in the emission area EA to form the organic light-emitting diode OLE.

Figure 6D:
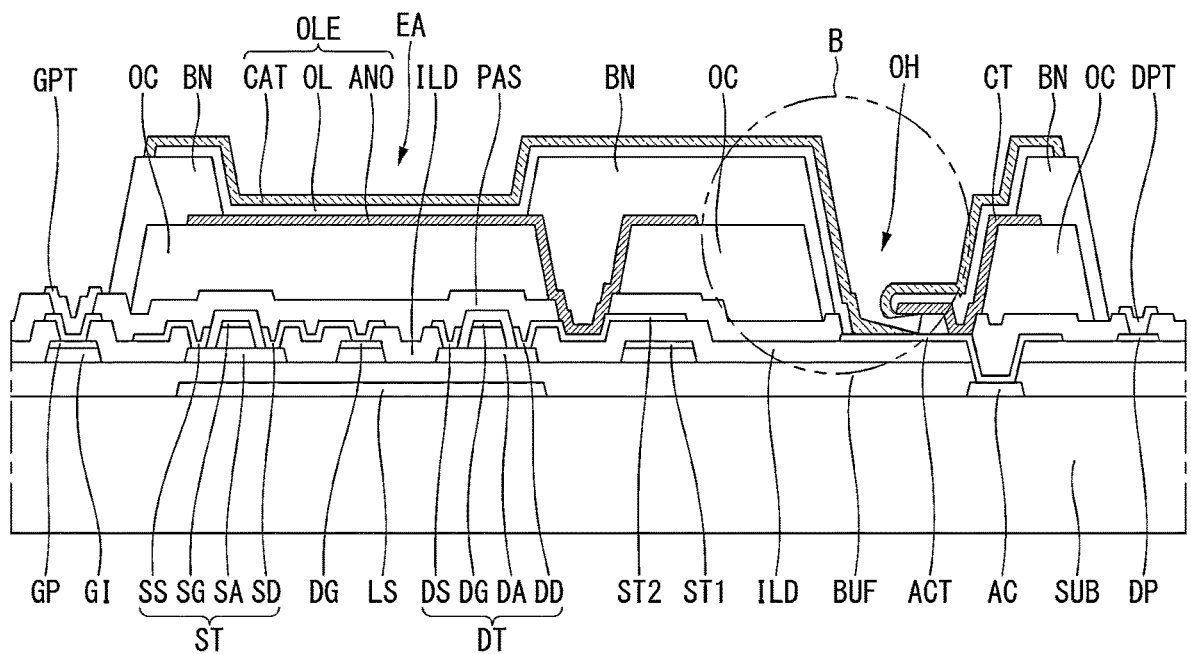

When the cathode CAT is formed through sputtering, the cathode CAT is formed along the geometry of the surface thereunder. The transparent conductive material is deposited on a region in which the organic emission layer OL is not formed as well as the surface of the organic emission layer OL. That is, the transparent conductive material is deposited on the one side of the undercut opening OH at which the connection terminal CT is not formed along the inclined surface thereof and also deposited in the under area UA. As a result, the cathode CAT is physically connected to the portion of the auxiliary cathode ACT which is exposed because the organic emission layer OL is not formed thereon in the under area UA (FIG. 6D).

In the second embodiment, the cathode CAT is connected to the auxiliary cathode ACT in the undercut opening OH. In addition, the undercut opening OH is formed using a half-tone mask in the mask process for forming the bank BN and thus the number of mask processes can be reduced. However, since the etched side of the bank BN is long in the undercut opening OH, the cathode CAT may be disconnected. The gate pad terminal GPT connected to the gate pad connection terminal GP1 through the gate pad contact hole GPH. The data pad terminal DPT connected to the data pad DP through the data pad contact hole DPH. For example, the gate pad terminal GPT and data pad terminal DPT are formed of a metal oxide such as ITO or IZO but not limit thereto.

Figure 7:
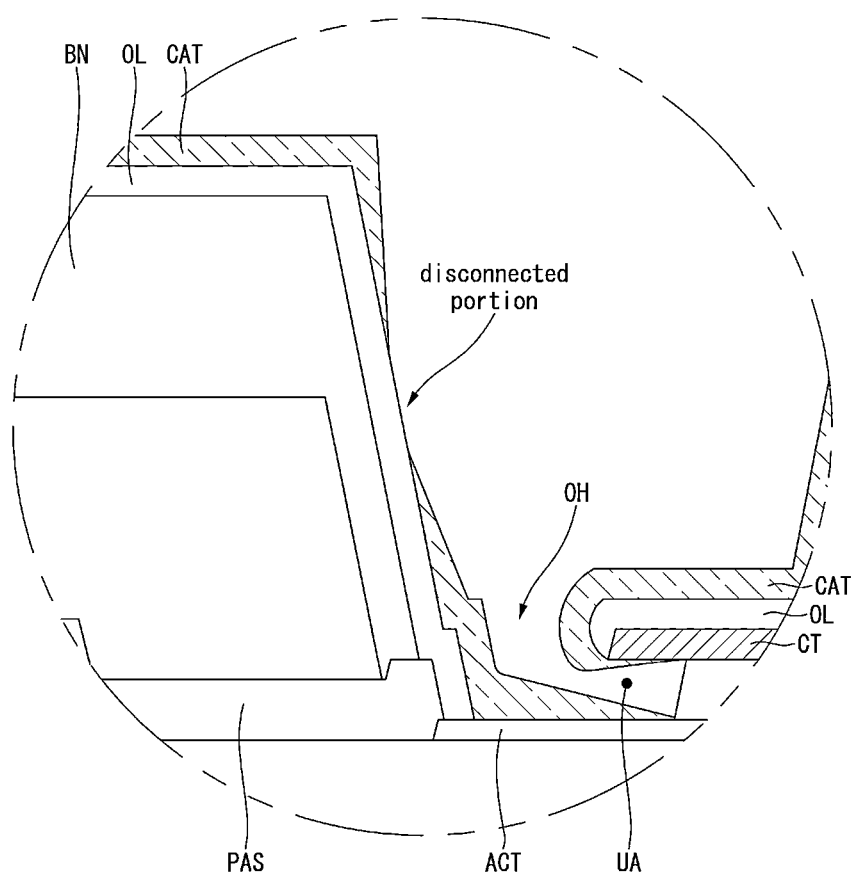
FIG. 7 is an enlarged cross-sectional view showing a disconnection structure of a cathode which can occur in the second embodiment of the present invention.

Referring to FIG. 7, the bank BN has a linear inclined portion extending to the passivation layer PAS in the undercut opening OH. FIG. 7 is an enlarged cross-sectional view showing a disconnection structure of the cathode which may occur in the second embodiment. In this case, although the organic material for forming the organic emission layer OL is normally coated, the transparent conductive material for forming the cathode CAT is coated excessively thin on a middle point of the inclined portion of bank BN and thus a disconnected portion may be generated. In this case, the cathode CAT may not be completely connected or the resistance thereof may abruptly increase to cause ununiformity of display.

For reference, there is a height difference between the bank BN and the overcoat layer OC in the first embodiment because the bank BN and the undercut opening OH are formed through different mask processes. Accordingly, problems with respect to disconnection of the cathode CAT are not generated.

Third Embodiment

Hereinafter, manufacturing processes according to a third embodiment to solve a disconnection problem of the cathode which may be generated in the second embodiment will be described with reference to FIGS. 8A to 8D. FIGS. 8A to 8D are cross-sectional views showing the manufacturing processes according to the third embodiment of the present invention.

In the manufacturing processes according to the third embodiment, processes until the anode ANO and the connection terminal CT are formed are identical to those of the first embodiment. That is, the processes corresponding to those of FIGS. 4A to 4H are identical to those of the first embodiment, and thus description thereof is omitted. In processes of FIGS. 8A to 8D, a single mask process using a half-tone mask is performed.

Figure 8A:
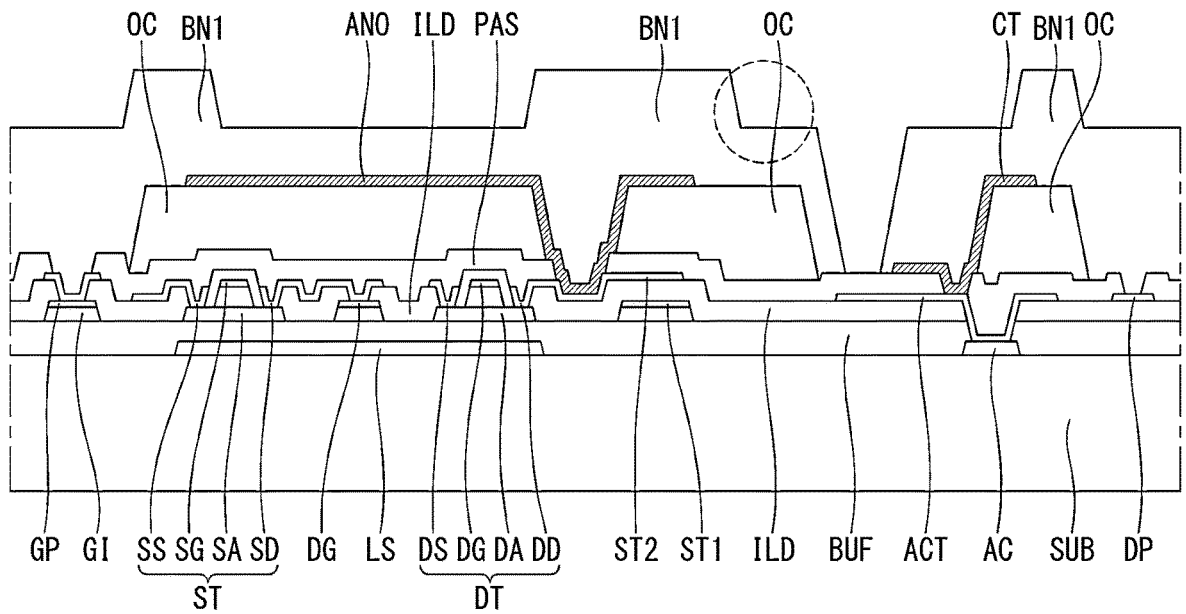
FIGS. 8A to 8D are cross-sectional views showing manufacturing processes of an OLED display according to a third embodiment of the present invention.

An organic material is coated on the overall surface of the substrate SUB on which the anode ANO and the connection terminal CT have been formed. The organic material layer is patterned through a ninth mask process to form a first bank BN1. Here, it is desirable that the ninth mask process uses a half-tone mask. That is, the portion of the first bank BN1 which corresponds to a region in which the undercut opening OH will be formed is removed, and the first bank BN1 having a first thickness in the emission area EA and a second thickness greater than the first thickness in the non-emission area is formed. Particularly, it is desirable to form the first bank BN 1 such that the first bank BN1 also has the first thickness at one side of the first undercut opening OH1 opposite the connection terminal CT, as indicated by a dotted line circle (FIG. 8A).

Figure 8B:
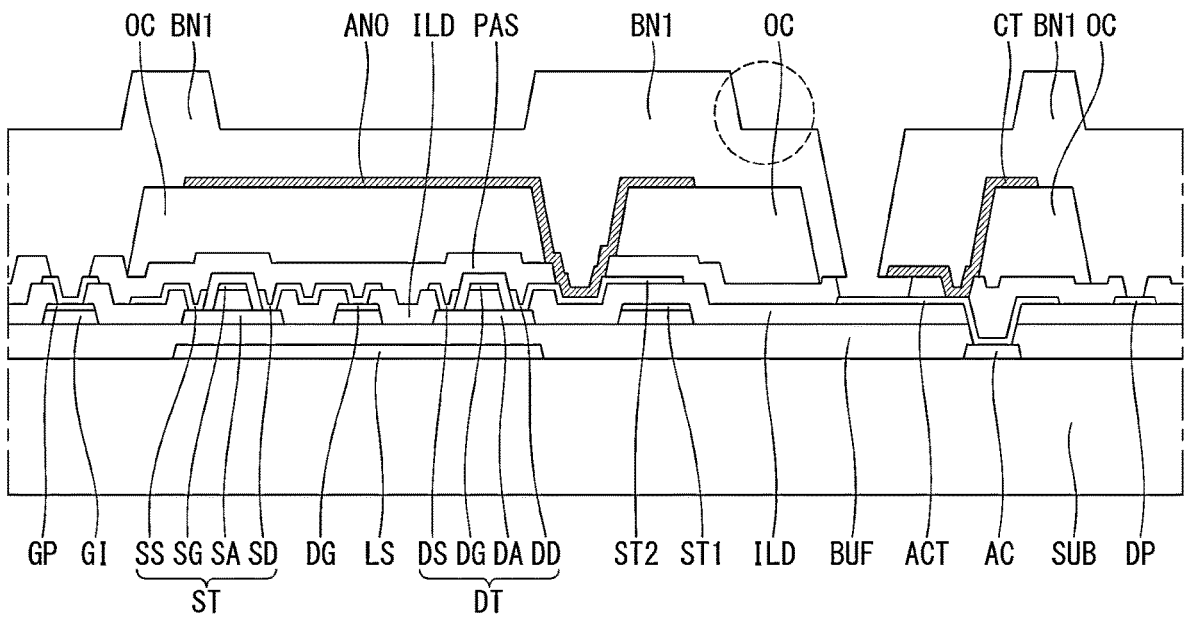

The portion of the passivation layer PAS exposed in the first undercut opening OH1 is etched using the first bank BN1 as a mask to form the undercut opening OH. Here, passivation layer etching time is controlled such that the portion of the passivation layer PAS disposed under the connection terminal CT is over-etched to have an undercut shape. The undercut opening OH formed by etching the passivation layer PAS exposes part of the auxiliary cathode ACT. Further, the passivation layer PAS is over-etched under the connection terminal CT to form the under area UA. The auxiliary cathode ACT is also exposed in the under area UA. Here, a gap corresponding to the thickness of the passivation layer PAS is formed between the connection terminal CT and the auxiliary cathode ACT and thus a cave-shaped void can be formed (FIG. 8B).

Figure 8C:
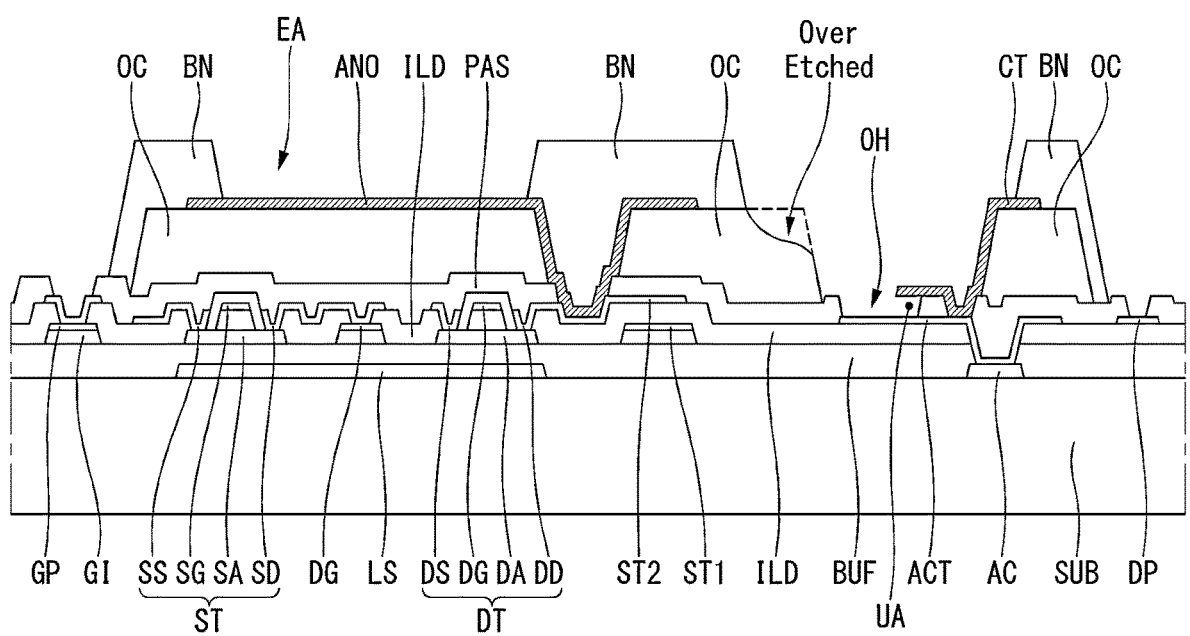

After formation of the undercut opening OH, ashing process is performed to thin the first bank BN1 to form the bank BN. Particularly, the portion of the first bank BN1 which corresponds to the emission area EA is removed to exposes the anode ANO. As a result, the bank BN remaining in the non-emission area has a thickness (second thickness–first thickness). The bank BN exposes the greater part of the anode ANO to define the emission area EA. Further, it is desirable to control the ashing process time such that a portion of the overcoat layer OC is over-etched at the side of the undercut opening OH opposite the connection terminal CT. Here, the over-etched portion of the overcoat layer OC has a gentler inclined portion than the etched side wall of the bank BN and extends to the bottom of the overcoat layer OC (FIG. 8C).

The organic emission layer OL is formed on the overall surface of the substrate SUB on which the bank BN having a gently over-etched side wall has been formed. The organic emission layer OL is formed by coating an organic material through thermal deposition. The organic emission layer OL is formed to cover the surface of the bank BN and the anode ANO. However, the organic emission layer OL is formed only on the exposed portion of the auxiliary cathode ACT on outer sides of the undercut opening OH. Particularly, the organic emission layer OL is not formed in the under area UA and thus the surface of the auxiliary cathode ACT is exposed in the under area UA.

After the organic emission layer OL is formed, a transparent conductive material is coated thereon to form the cathode CAT. The transparent conductive material includes indium-tin oxide (ITO) or indium-zinc oxide (IZO). The transparent conductive material is coated through sputtering. The transparent conductive material is deposited on the anode ANO and the organic emission layer OL in the emission area EA to form the organic light-emitting diode OLE.

Figure 8D:
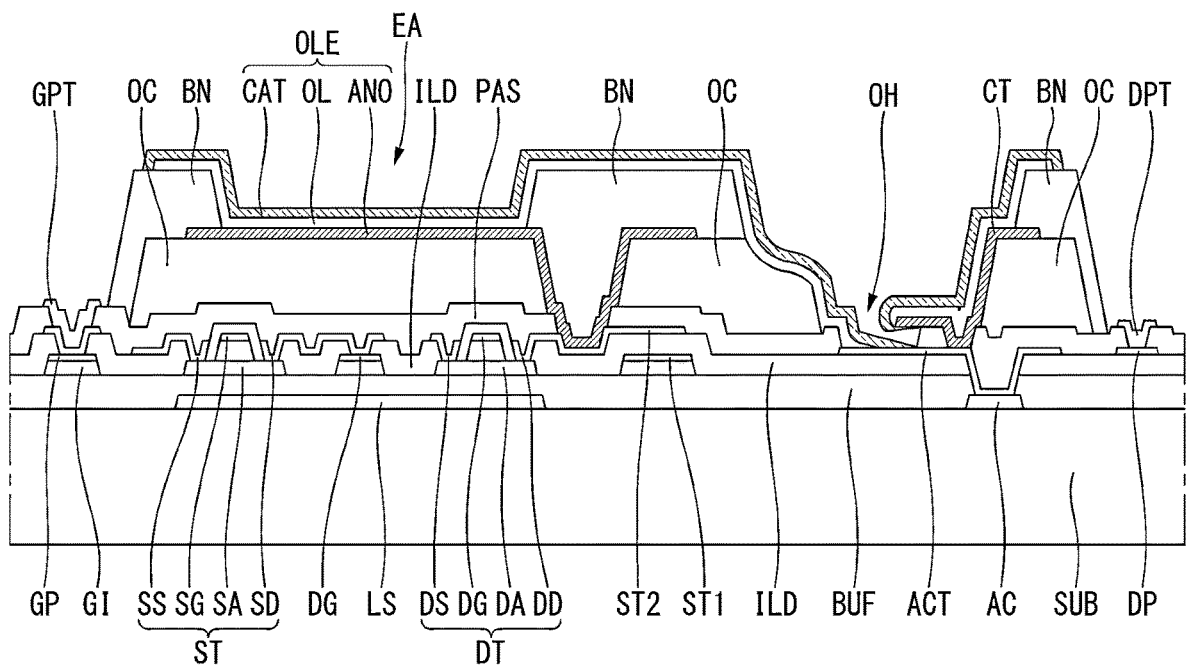

When the cathode CAT is formed through sputtering, the cathode CAT is formed along the geometry of the surface thereunder. The transparent conductive material is deposited on a region in which the organic emission layer OL is not formed as well as the surface of the organic emission layer OL. That is, the transparent conductive material is deposited on the one side of the undercut opening OH at which the connection terminal CT is not formed along the inclined surface thereof and also deposited in the under area UA. As a result, the cathode CAT is physically connected to the portion of the auxiliary cathode ACT which is exposed because the organic emission layer OL is not formed thereon in the under area UA. The gate pad terminal GPT connected to the gate pad connection terminal GP1 through the gate pad contact hole GPH. The data pad terminal DPT connected to the data pad DP through the data pad contact hole DPH. For example, the gate pad terminal GPT and data pad terminal DPT are formed of a metal oxide such as ITO or IZO but not limit thereto (FIG. 8D).

In the third embodiment, the cathode CAT is connected to the auxiliary cathode ACT in the undercut opening OH. In addition, the undercut opening OH is formed using a halftone mask in the mask process for forming the bank BN and thus the number of mask processes can be reduced.

Furthermore, a portion of the overcoat layer OC is exposed at the side of the undercut opening OH opposite the connection terminal CT and over-etched, distinguished from the second embodiment. Consequently, the overcoat layer OC has an gentle inclined portion extending to the passivation layer PAS of the undercut opening OH. In this case, the transparent conductive material for forming the cathode CAT can be uniformly deposited on the organic emission layer OL without a disconnected portion. That is, according to the manufacturing processes of the third embodiment, the cathodes are correctly connected over the substrate and thus ununiformity of display does not occur.

While the embodiment of the present invention has been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

The present invention provides a large area OLED display including auxiliary cathodes formed using a light-shielding layer for protecting a metal-oxide-semiconductor material from external light. It is possible to physically and electrically connect auxiliary cathodes and cathodes without an additional mask process by forming an undercut structure is formed using a halftone mask. The present invention can provide a large area OLED display having a structure capable of reducing the resistance of cathodes. Furthermore, the present invention can decrease the number of mask processes to reduce manufacturing time and manufacturing costs.

It will be apparent to those skilled in the art that various modifications and variations can be made in the large area organic light-emitting diode (OLED) display of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light-emitting diode (OLED) display comprising:
a substrate;
an auxiliary cathode on the substrate;
a passivation layer on the auxiliary cathode;
an overcoat layer on the passivation layer;
a metal layer directly on the overcoat layer and the passivation layer;
an undercut opening penetrating the overcoat layer and the passivation layer to expose a portion of the auxiliary cathode, wherein the undercut opening includes an under area under one side of the metal layer,
an anode on the overcoat layer;
an organic emission layer on the anode; and
a cathode on the organic emission layer,
wherein the organic emission layer is directly on a side of the passivation layer in the undercut opening.

2. The OLED display of claim 1, wherein the under area is not under the overcoat layer.

3. The OLED display of claim 1, wherein a first side surface of the passivation layer is protruded from the overcoat layer toward the under area in the undercut opening.

4. The OLED display of claim 3, wherein the one side of the metal layer is protruded from a second side surface of the passivation layer which faces to the first side surface of the passivation layer in the undercut opening.

5. The OLED display of claim 1, wherein the metal layer includes a first portion which is directly on the passivation layer and parallel with the auxiliary cathode, a second portion which is directly on the overcoat layer.

6. The OLED display of claim 1,
wherein the cathode is directly connected to the exposed portion of the auxiliary cathode in the under area of the undercut opening.

7. The OLED display of claim 6, wherein the metal layer is at the same level as the anode.

8. The OLED display of claim 6, wherein the undercut opening includes one side exposing an etched side wall of the overcoat layer and an etched side wall of the passivation layer, and the other side exposing the metal layer, wherein a portion of the passivation layer under the metal layer is over-etched to expose a portion of the metal layer at the other side of the undercut opening, wherein the cathode of the one side exposing the etched side wall of the overcoat layer and the etched side wall of the passivation layer is directly connected with the auxiliary cathode; and wherein the cathode of the other side exposing the metal layer is electrically connected with the auxiliary cathode through the metal layer, wherein, on the one side of the undercut opening, the etched side wall of the overcoat layer and the etched side wall of the passivation layer are covered by the cathode.

9. The OLED display of claim 1, wherein the metal layer overlaps with at least two sides of the undercut opening.

10. The OLED display of claim 9, wherein the metal layer overlaps with adjacent two sides of the undercut opening.

11. The OLED display of claim 1, wherein the metal layer completely overlaps with the auxiliary cathode.

12. The OLED display of claim 11, further comprising an auxiliary connection line between the substrate and the auxiliary cathode, wherein the auxiliary cathode completely overlaps with the auxiliary connection line.

13. The OLED display of claim 12, further comprising:

a light-shielding layer on the substrate at the same level as the auxiliary connection line; and a thin film transistor on the light-shielding layer and under the passivation layer.

14. The OLED display of claim 13, wherein the thin film transistor includes a drain electrode between the substrate and the passivation layer, wherein the auxiliary cathode is at the same level as the drain electrode.

\* \* \* \* \*